(12) United States Patent  
Hu (10) Patent No.: US 10,957,751 B2  
(45) Date of Patent: Mar. 23, 2021

(54) PIXEL DEFINING LAYER AND MANUFACTURING METHOD THEREOF, DISPLAY SUBSTRATE, DISPLAY PANEL

(71) Applicant: BOE TECHNOLOGY GROUP CO., LTD., Beijing (CN)

(72) Inventor: Chunjing Hu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 282 days.

(21) Appl. No.: 16/322,927

(22) PCT Filed: Apr. 25, 2018

(86) PCT No.: PCT/CN2018/084428  
§ 371 (c)(1),  
(2) Date: Feb. 1, 2019

(87) PCT Pub. No.: WO2019/033781  
PCT Pub. Date: Feb. 21, 2019

(65) Prior Publication Data  
US 2021/0020711 A1 Jan. 21, 2021

(30) Foreign Application Priority Data  
Aug. 17, 2017 (CN) .................. 201710706873.8

(51) Int. Cl.  
*H01L 27/32* (2006.01)  
*H01L 51/56* (2006.01)

(52) U.S. Cl.  
CPC .......... *H01L 27/3246* (2013.01); *H01L 51/56* (2013.01)

(58) Field of Classification Search  
CPC . H01L 27/3246; H01L 51/56; H01L 51/0005; H01L 51/0012; H01L 51/0004; H01L 27/326  
See application file for complete search history.

(56) References Cited

U.S. PATENT DOCUMENTS 7,763,314 B2  7/2010  Dai et al.  
9,466,650 B2  10/2016  Wang et al.  
(Continued)

FOREIGN PATENT DOCUMENTS

CN  102623399 A  8/2012  
CN  102623399 B  8/2014  
(Continued)

OTHER PUBLICATIONS

International Search Report and Written Opinion dated Jul. 31, 2018, from application No. PCT/CN2018/084428.

*Primary Examiner* — Jaehwan Oh  
(74) *Attorney, Agent, or Firm* — Arch & Lake LLP (57) ABSTRACT

The present disclosure provides various arrangements of a pixel defining layer. The pixel defining layer includes first and second sub-defining layers sequentially and laminatedly disposed on a base substrate. An orthographic projection of the second sub-defining layer less closer to the base substrate on the base substrate is located within an orthographic projection of the first sub-defining layer closer to the base substrate on the base substrate. A surface of each of the first and second sub-defining layers parallel to a surface of the base substrate is a lyophobic surface, a side surface of each of the first and second sub-defining layers is a lyophilic surface.

20 Claims, 5 Drawing Sheets (56) References Cited

U.S. PATENT DOCUMENTS

| | | |
|---|---|---|
| 9,929,342 B2 | 3/2018 | Dai |
| 2009/0191334 A1 | 7/2009 | Dai et al. |
| 2016/0056218 A1 | 2/2016 | Wang et al. |
| 2017/0186828 A1* | 6/2017 | Hsin .................... H01L 27/1225 |
| 2017/0279049 A1 | 9/2017 | Dai |
| 2018/0138411 A1* | 5/2018 | Hung ................... H01L 51/0012 |
| 2019/0096970 A1* | 3/2019 | Hou ..................... H01L 27/3211 |
| 2019/0148468 A1* | 5/2019 | Jia ........................ H01L 27/3246 257/40 |
| 2019/0305058 A1* | 10/2019 | Hou ..................... H01L 51/0005 |
| 2020/0075879 A1* | 3/2020 | Luo ..................... H01L 27/3244 |

FOREIGN PATENT DOCUMENTS

| | | |
|---|---|---|
| CN | 104241329 A | 12/2014 |
| CN | 104538351 A | 4/2015 |
| CN | 104733505 A | 6/2015 |
| CN | 105774279 A | 7/2016 |
| CN | 107527939 A | 12/2017 |
| EP | 3 242 344 A1 | 11/2017 |

\* cited by examiner

PIXEL DEFINING LAYER AND MANUFACTURING METHOD THEREOF, DISPLAY SUBSTRATE, DISPLAY PANEL

CROSS REFERENCE OF RELATED APPLICATIONS

The present application is based upon International Application No. PCT/CN2018/084428, filed on Apr. 25, 2018, which claims the priority of Chinese Patent Application No. 201710706873.8, filed on Aug. 17, 2017, and the entire contents thereof are incorporated herein by reference as part of the present application.

TECHNICAL FIELD

The present disclosure relates to the field of display technology, and particularly, to a pixel defining layer, a manufacturing method thereof, a display substrate, and a display panel.

BACKGROUND

An organic light-emitting diode (OLED) display panel includes an anode, an organic light emitting layer, a cathode, and the like. The organic light emitting layer includes a hole injection layer, a hole transport layer, an organic light emitting material layer, an electron transport layer, an electron injection layer, and the like. The organic light emitting layer can be manufactured using an inkjet printing technique. When the organic light emitting layer is manufactured by using the inkjet printing technique, a pixel defining layer is formed on the glass substrate, and then a solution dissolving a material of the organic light emitting layer is sprayed onto a glass substrate on which a pixel defining layer is formed, to form an organic light emitting layer.

It should be noted that the information disclosed in the Background section above is only for enhancing the understanding of the background of the present disclosure, and thus may include information that does not constitute prior art known to those of ordinary skill in the art.

SUMMARY

In a first aspect, there is provided a pixel defining layer. The pixel defining layer includes first and second sub-defining layers sequentially and laminatedly disposed on a base substrate.

An orthographic projection of the second sub-defining layer, less closer to the base substrate, on the base substrate is located within an orthographic projection of the first sub-defining layer, closer to the base substrate, on the base substrate. A surface of each of the first and second sub-defining layers parallel to a surface of the base substrate is a lyophobic surface, a side surface of each of the first and second sub-defining layers is a lyophilic surface.

In some arrangements, a lyophilic sub-defining layer is further disposed between the base substrate and the first and second two sub-defining layers. An orthographic projection of the lyophilic sub-defining layer on the base substrate incorporates the orthographic projections of the first and second two sub-defining layers on the base substrate. A surface of the lyophilic sub-defining layer is a lyophilic surface.

In some arrangements, the first and second sub-defining layers are formed of an identical material.

In some arrangements, the first and second sub-defining layers are formed of a fluorine-containing photosensitive material.

In some arrangements, a fluorine content of the lyophobic surface is higher than that of the lyophilic surface.

In some arrangements, the first and second sub-defining layers are formed in an integrated structure.

In a second aspect, there is provided a method of manufacturing a pixel defining layer. The method includes
providing a base substrate. The method includes
forming first and second sub-defining layers on the base substrate. An orthographic projection of the second sub-defining layer less closer to the base substrate on the base substrate is located within an orthographic projection of the first sub-defining layer closer to the base substrate on the base substrate. A surface of each of the first and second sub-defining layers parallel to a surface of the base substrate is a lyophobic surface, a side surface of each of the first and second sub-defining layers is a lyophilic surface.

In some arrangements, before forming the first and second sub-defining layers on the base substrate, the method further includes:
  forming a lyophilic sub-defining layer on the base substrate. An orthographic projection of the lyophilic sub-defining layer on the base substrate incorporates the orthographic projections of the first and second sub-defining layers on the base substrate. A surface of the lyophilic sub-defining layer is a lyophilic surface.

In some arrangements, forming first and second sub-defining layers on the base substrate includes
  forming a sub-defining film layer on the base substrate. Such an operation includes exposing the sub-defining film layer with a halftone mask from a side of the second sub-defining film layer. The operation includes developing the exposed sub-defining film layer. The method includes
  performing thermal treatment on the developed sub-defining film layer to obtain the at least two sub-defining layers.

In some arrangements, the sub-defining film layer is formed of a fluorine-containing photosensitive material.

In some arrangements, a fluorine content of the lyophobic surface is higher than that of the lyophilic surface.

In some arrangements, the halftone mask includes at least two light transmitting regions, and the at least two light transmitting regions have different degrees of light transmission. Exposing the sub-defining film layer with a halftone mask includes exposing the sub-defining film layer through the at least two light transmitting regions, such that the exposed sub-defining film layer comprises at least two exposed regions. Respective exposed regions of the exposed sub-defining film layer have different thicknesses after developing the exposed sub-defining film layer.

In a third aspect, there is provided a display substrate. The display substrate includes a base substrate and a pixel defining layer disposed on the base substrate. The pixel defining layer is the pixel defining layer according to any one of the first aspect.

In some arrangements, the display substrate further includes an anode disposed between the base substrate and the pixel defining layer, and an organic light emitting layer disposed on a side of the anode away from the base substrate.

In some arrangements, the organic light emitting layer includes: at least two sub-layers disposed in a laminated manner. The at least two sub-layers include a first sub-layer and a second sub-layer. An upper surface of the first sub-defining layer is substantially coplanar with an upper surface of the first sub-layer, and an upper surface of the second sub-defining layer is substantially coplanar with an upper surface of the second sub-layer.

In some arrangements, an edge portion of the first sub-layer extends to the upper surface of the first sub-defining layer and covers at least a portion of the upper surface of the first sub-defining layer and at least a portion of a side surface of the second sub-defining layer.

In some arrangements, a thickness of the edge portion of the first sub-layer extending onto the upper surface of the first sub-defining layer is much smaller than a thickness of the first sub-layer.

In some arrangements, centers of the orthographic projections of the first and second sub-defining layers coincide.

In some arrangements, edges of the orthographic projections of the first and second sub-defining layers are offset by a certain distance.

In a fourth aspect, there is provided a display panel including the display substrate according to any one of the third aspect.

It should be understood that, the above general description and the following detailed description are only intended to be exemplary and illustrative and cannot limit the present disclosure.

This section provides an overview of various implementations or examples of the techniques described in the present disclosure, and is not a comprehensive disclosure of all scopes or all features of the disclosed technology.

BRIEF DESCRIPTION OF THE DRAWINGS

In order to more clearly illustrate the technical solutions in arrangements of the present disclosure, the drawings to be used in the arrangements will be briefly described below. Obviously, the drawings in the following description are only certain arrangements of the present disclosure, and other drawings can be obtained from those skilled in the art based on these drawings without any creative work.

FIG. 1-1 is a schematic view showing a film layer forming a coffee ring according to a comparative arrangement;

FIG. 1-2 is a schematic structural diagram of a pixel defining layer according to a comparative arrangement;

FIG. 1-3 is a schematic structural diagram of another pixel defining layer according to a comparative arrangement;

FIG. 5-1 is a schematic structural diagram of forming a lyophilic sub-defining layer on a base substrate provided in an arrangement of the present disclosure;

FIG. 5-2 is a flowchart of a method of forming at least two sub-defining layers on a base substrate formed with a lyophilic sub-defining layer according to an arrangement of the present disclosure;

FIG. 5-3 is a schematic structural view of a sub-defining film layer formed on a base substrate formed with a lyophilic sub-defining layer according to an arrangement of the present disclosure;

FIG. 5-4 is a schematic diagram of exposing a sub-defining film layer using a halftone mask according to an arrangement of the present disclosure;

FIG. 5-5 is a schematic structural diagrams of a pixel defining layer according to still another arrangement of the present disclosure;

DETAILED DESCRIPTION

In order to make the above objects, technical solutions and improvements of the present disclosure more clear, the arrangements of the present disclosure will be further described in detail below with reference to the accompanying drawings.

Compared with a liquid crystal display, the OLED display has improvements of self-luminescence, fast response, wide viewing angle, high brightness, colorfulness, lightness and thinness, and the like. A method of manufacturing a film layer in the organic electroluminescent device mainly includes vacuum evaporation and solution process. The vacuum evaporation is suitable for film formation of organic small molecular materials, and has improvements of good film formation uniformity and relatively mature technology, and has been applied in mass production. The solution process includes spin coating, inkjet printing, and nozzle coating methods and the like. Among them, the inkjet printing technology is considered to be an important manner for mass production of large-sized OLEDs due to its high material utilization rate and achievable large size. The inkjet printing technology requires to form a pixel defining layer on a base substrate on which an anode is formed in advance, to define that the solution of the inkjet printing can accurately flow into a designated R/G/B sub-pixel region.

Figure 11:
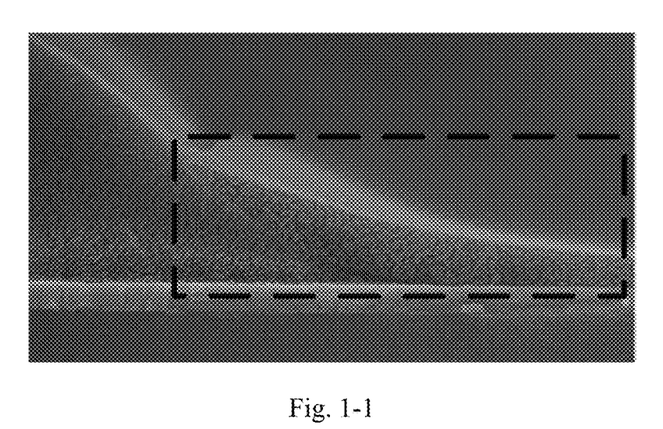
Figure 12:
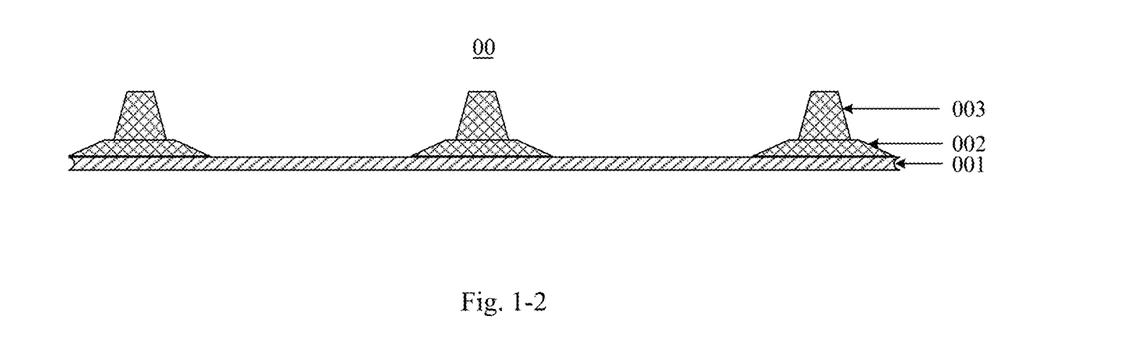
Figure 13:
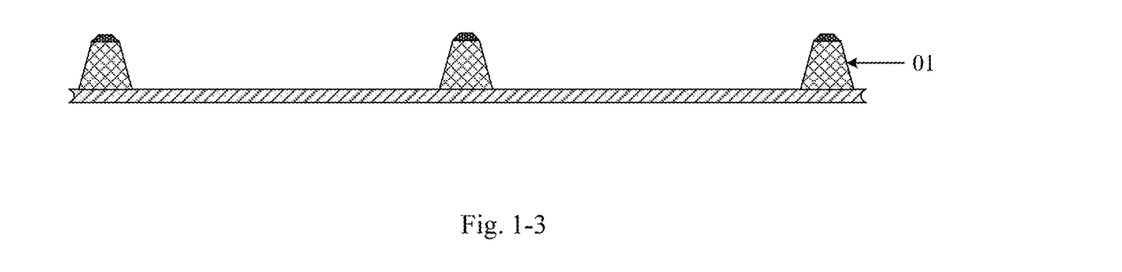

According to a comparative arrangement, a cross section of the pixel defining layer in a thickness direction is an "upright" trapezoid, and the pixel defining layer is formed of a lyophobic material. A difference in surface energy exists between the solution of the inkjet printing and the pixel defining layer, a side surface of the pixel defining layer has a certain inclination angle, and the solution has a certain drying characteristic, therefore, the solution has a certain degree of climbing on the pixel defining layer, which causes that the organic light emitting layer formed after the solution is dried is prone to be thin in the middle and thick at the edge (i.e., the coffee ring effect shown in the dashed box in FIG. 1-1). On the one hand, it may cause electric leakage at the edge of the pixel due to the occurrence of small holes, and on the other hand, uniformity of brightness in the pixel will also be affected due to uneven film thickness of the organic light emitting layer. Compared with the pixel defining layer, the pixel defining layer shown in FIGS. 1-2 and 1-3 can inhibit the solution from climbing on the pixel defining layer to some extent.

Specifically, the pixel defining layer 00 shown in FIG. 1-2 includes a lyophilic layer 002 (usually formed of silicon oxide or silicon nitride) and a lyophobic layer 003, which are sequentially and laminatedly disposed on a base substrate 001. The attraction of the lyophilic layer 002 to the solution can ensure that the solution flows into the pixel region, and it can reduce the difference in material properties from the anode and the height difference between the film layers. The repellency of the lyophobic layer 003 to the solution can inhibit the solution from climbing on the pixel defining layer, to avoid occurrence of small holes at edges of the pixels and to improve the uniformity of brightness within the pixels. The pixel defining layer 01 shown in FIG. 1-3 is formed of a fluorine-containing material. If the fluorine-containing material is heated, fluorine-containing components in the material will be moved up to a surface of the pixel defining layer (the portion filled with dots in FIG. 1-3), such that the side surface of the pixel defining layer is lyophilic, and the surface of the pixel defining layer is lyophobic. Thus, the pixel defining layer can inhibit the climbing of the solution on the pixel defining layer to some extent. However, when the organic light emitting layer includes a plurality of film layers, the pixel defining layer shown in FIGS. 1-2 and 1-3 can only suppress the climbing of the film layer close to the lyophobic layer to some extent. Therefore, when a solution of other film layers in the organic light emitting layer is ink-jet printed, the solution will still climb on the pixel defining layer to a certain degree. That is, the film formation uniformity of the solution in the pixel region is still affected.

Figure 2:
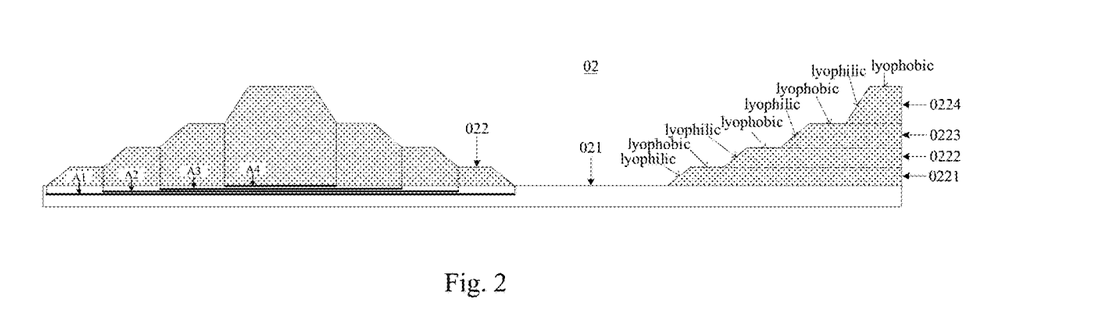
FIG. 2 is a schematic structural diagram of a pixel defining layer according to an arrangement of the present disclosure.

As for the above problems according to the comparative arrangement, the arrangement of the present disclosure provides a pixel defining layer 02. As shown in FIG. 2, the pixel defining layer 02 may include: at least two sub-defining layers 022 sequentially and laminatedly disposed on a base substrate 021. The arrangement of the present disclosure is described by taking a pixel defining layer that includes four sub-defining layers 0221, 0222, 0223, and 0224 as an example.

In the arrangement, in every two sub-defining layers contacting each other, a first orthographic projection of the sub-defining layer away from the base substrate 021 on the base substrate 021 is located within a second orthographic projection of the sub-defining layer close to the base substrate 021 on the base substrate 021 (as shown in FIG. 2, orthographic projections A1, A2, A3, and A4 of the four sub-defining layers 0221, 0022, 0223, and 0224 on the base substrate sequentially decreasing), and a surface of each sub-defining layer parallel to a surface of the base substrate 021 (ideally, the surface of each sub-defining layer in a horizontal direction is parallel to the base substrate. In practical applications, a slight angle may exist between a side surface of the sub-defining layer and the base substrate due to factors such as machining tolerance. In such a case, the surface of the sub-defining layer, parallel to the base substrate, is lyophobic (i.e., having a lyophobic surface), and the side surface of the sub-defining layer is lyophilic (i.e., having a lyophilic surface).

It should be noted that, in this arrangement, an edge of the first orthographic projection and an edge of the second orthographic projection (more specifically, an edge of the first orthographic projection adjacent to an open area of the pixel defining layer and an edge of the second orthographic projection adjacent to an open area of the pixel defining layer) are not coincide. That is, the edges of the two orthographic projections are offset by a certain distance. By adjusting the distance between the two orthographic projections, adjusting the thickness of the sub-defining layer, and combining the lyophilicity of the surface of each sub-defining layer and the lyophobicity of the side surface of each sub-defining layer, the degree of climbing of the solution on the pixel defining layer can be adjusted correspondingly, thus improving the film formation uniformity of the solution in the pixel region.

Although only two pixel defining layers on two sides of one pixel region are shown in FIG. 2, it is noted that any number of pixel defining layers can be formed on a base substrate (e.g., 021) while remaining within the scope of the present disclosure. In FIG. 2, a complete structure of the pixel defining layer on the left side is shown, and only a structure of the left part of the pixel defining layer on the right side is shown. A structure of the right part of the pixel defining layer on the right side may be referred to the structure of the pixel defining layer on the left side, and the structures of the two pixel defining layers on both sides of other pixel regions may also be referred to the structure of the pixel defining layer on the left side (i.e., the side surface of the pixel defining layer has a step like structure).

In summary, the pixel defining layer provided by the arrangement of the present disclosure includes at least two sub-defining layers sequentially and laminatedly disposed on a base substrate, and the surface of each sub-defining layer parallel to a surface of the base substrate is lyophobic, the side surface of each sub-defining layer is lyophilic, the lyophilic side surfaces attract the solution to ensure that the solution flows into the pixel region, and the lyophobic surfaces repel the solution to inhibit the solution from climbing on the pixel defining layer. In the pixel defining layer, each of the sub-defining layers suppresses climbing of one corresponding film layer in the organic light emitting layer on the pixel defining layer, so that climbing of a plurality of film layers included in the organic light emitting layer on the pixel defining layer is suppressed, which effectively improves the film formation uniformity of the solution in the pixel region, thus improving the uniformity of brightness in the pixel.

Alternatively, centers of the first orthographic projection and the second orthographic projection may coincide. As shown in FIG. 2, centers of the orthographic projections A1, A2, A3, and A4 coincide. In this way, the left side and the right side of each pixel defining layer are symmetrical, so that the degree of climbing of the film layer in the pixel region on the left side and the right side of the pixel defining layer is almost the same, further improving the film formation uniformity of the solution in the pixel region.

Figure 3:
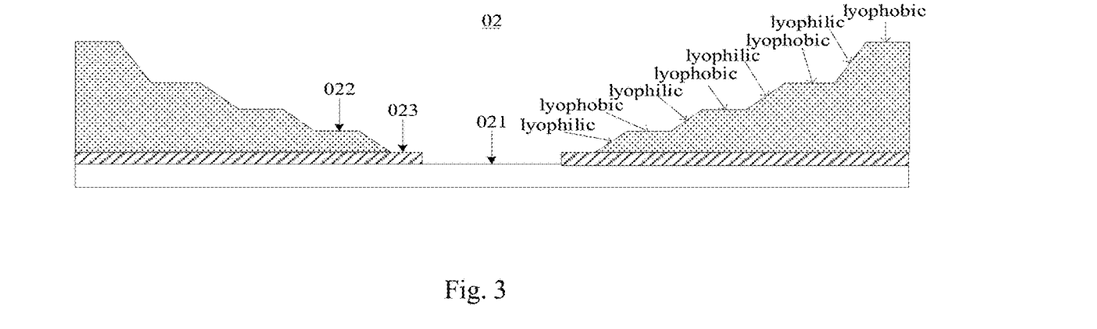
FIG. 3 is a schematic structural diagram of a pixel defining layer according to another arrangement of the present disclosure.

Further, as shown in FIG. 3, a lyophilic sub-defining layer 023 is further disposed between the base substrate 021 and the at least two sub-defining layers 022, an orthographic projection of the lyophilic sub-defining layer 023 on the base substrate 021 incorporates the orthographic projections of the at least two sub-defining layers 022 on the base substrate 021. The lyophilic sub-defining layer 023 is lyophilic, which can further ensure that the solution at the time of inkjet printing enters the pixel region.

Alternatively, at least two sub-defining layers in the pixel defining layer may be formed of the same material. When it is formed of the same material, the at least two sub-defining layers can be formed by one patterning process, thus simplifying the manufacturing process of the pixel defining layer. Illustratively, each of the at least two sub-defining layers may be formed of a fluorine-containing photosensitive material. For example, each of the at least two sub-defining layers may be formed of Asahi Glass AGC adhesive. The material of the sub-defining layer contains fluorine, such that when the sub-defining film layer forming the sub-defining layer is subjected to thermal treatment (for example, baking), the fluorine-containing component in the material can move up to the surface of the sub-defining layer. In this way, the surface of the sub-defining layer formed after the thermal treatment is lyophobic, and the side surface of the sub-defining layer is lyophilic.

Also, the at least two sub-defining layers may be formed in an integrated structure. When the at least two sub-defining layers are formed in the integrated structure, the at least two sub-defining layers can be formed by one sub-defining film layer through a plurality of patterning processes, or the at least two sub-defining layers can be formed by one sub-defining film layer through one patterning process using a mask having different light transmittances. When at least two sub-defining layers are formed by one sub-defining film layer through one patterning process, the manufacturing process of manufacturing the pixel defining layer can be simplified.

In summary, the pixel defining layer provided by the arrangement of the present disclosure includes at least two sub-defining layers sequentially and laminatedly disposed on a base substrate, and the surface of each sub-defining layer parallel to a surface of the base substrate is lyophobic, the side surface of each sub-defining layer is lyophilic, the lyophilic side surfaces attract the solution to ensure that the solution flows into the pixel region, and the lyophobic surfaces repel the solution to inhibit the solution from climbing on the pixel defining layer. In the pixel defining layer, each of the sub-defining layers suppresses climbing of one corresponding film layer in the organic light emitting layer on the pixel defining layer, so that climbing of a plurality of film layers included in the organic light emitting layer on the pixel defining layer is suppressed, which effectively improves the film formation uniformity of the solution in the pixel region, thus improving the uniformity of brightness in the pixel. Moreover, compared with the pixel defining layer according to the comparative arrangement, the pixel defining layer provided by the arrangement of the present disclosure can also simplify the manufacturing process of the pixel defining layer, thus reducing the probability of poorly manufacturing the pixel defining layer and reducing the manufacturing cost of the pixel defining layer.

Figure 4:
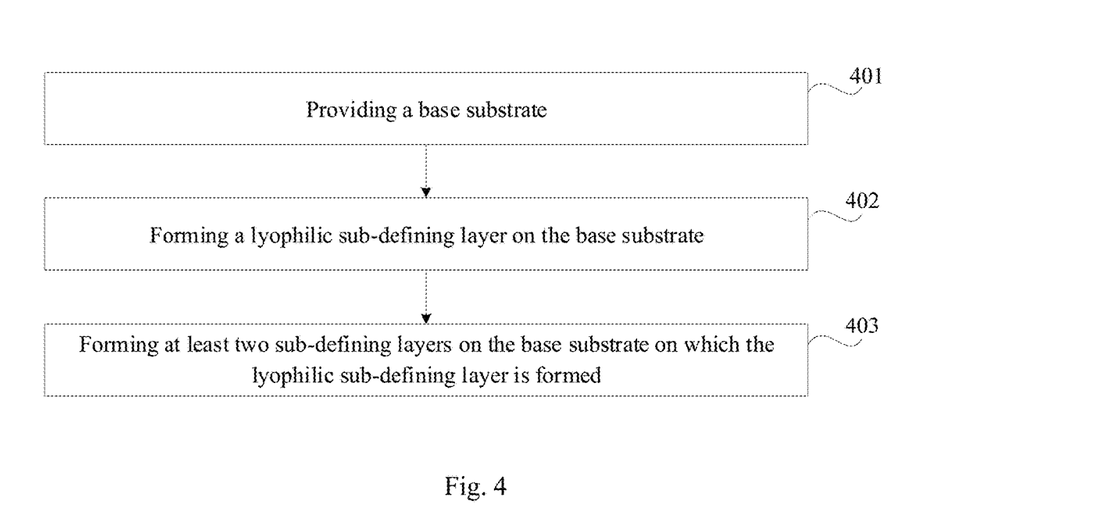
FIG. 4 is a flowchart of a method of manufacturing a pixel defining layer according to an arrangement of the present disclosure.

An arrangement of the present disclosure provides a method of manufacturing a pixel defining layer. As shown in FIG. 4, the method may include following blocks.

Block 401, abase substrate is provided.

The base substrate may be a transparent substrate, which may specifically be a substrate formed of a transparent non-metal material with a certain hardness, such as glass, quartz, or a transparent resin.

Block 402, a lyophilic sub-defining layer is formed on the base substrate.

In the arrangement, the lyophilic sub-defining layer is lyophilic.

Figure 51:
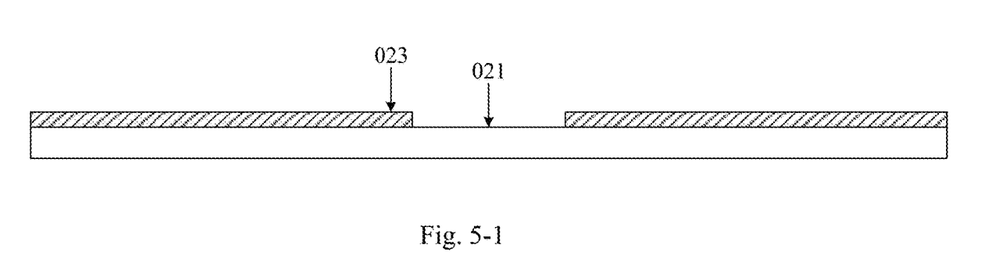

A lyophilic material having a certain thickness may be deposited on the base substrate by magnetron sputtering, thermal evaporation or plasma enhanced chemical vapor deposition (PECVD) or the like, to obtain a lyophilic material film layer. Then the lyophilic material film layer is processed by a patterning process, to obtain a lyophilic sub-defining layer having a certain pattern. The patterning process includes: photoresist coating, exposure, development, etching, and photoresist stripping. Optionally, the lyophilic material may be any one of lyophilic materials such as silicon dioxide and silicon nitride. For example, please refer to FIG. 5-1, which is a schematic structural diagram of a lyophilic sub-defining layer 023 formed on a base substrate 021 according to an arrangement of the present disclosure.

It should be noted that, before the lyophilic sub-defining layer is formed on the substrate, a thin film transistor (TFT) array, a flat layer, and an anode and other structures may also be formed on the substrate.

Block 403, at least two sub-defining layers are formed on the base substrate on which the lyophilic sub-defining layer is formed.

In the arrangement, the orthographic projection of the lyophilic sub-defining layer on the base substrate incorporates orthographic projections of at least two sub-defining layers on the base substrate. In every two sub-defining layers contacting each other, a first orthographic projection of the sub-defining layer away from the base substrate on the base substrate is located within a second orthographic projection of the sub-defining layer close to the base substrate on the base substrate, an edge of the first orthographic projection does not coincide with an edge of the second orthographic projection, and the surface of each sub-defining layer parallel to a surface of the base substrate is lyophobic, the side surface of each sub-defining layer is lyophilic. Optionally, centers of the first orthographic projection and the second orthographic projection may coincide. For example, FIG. 3 is a schematic diagram of a structure after forming at least two sub-defining layers 022 on a base substrate on which a lyophilic sub-defining layer is formed.

In summary, in a method of manufacturing a pixel defining layer according to an arrangement of the present disclosure, the pixel defining layer manufactured by the method includes at least two sub-defining layers sequentially and laminatedly disposed on a base substrate, and the surface of each sub-defining layer parallel to a surface of the base substrate is lyophobic, the side surface of each sub-defining layer is lyophilic, the lyophilic side surfaces attract the solution to ensure that the solution flows into the pixel region, and the lyophobic surfaces repel the solution to inhibit the solution from climbing on the pixel defining layer. In the pixel defining layer, each of the sub-defining layers suppresses climbing of one corresponding film layer in the organic light emitting layer on the pixel defining layer, so that climbing of a plurality of film layers included in the organic light emitting layer on the pixel defining layer is suppressed, which effectively improves the film formation uniformity of the solution in the pixel region, thus improving the uniformity of brightness in the pixel.

Figure 52:
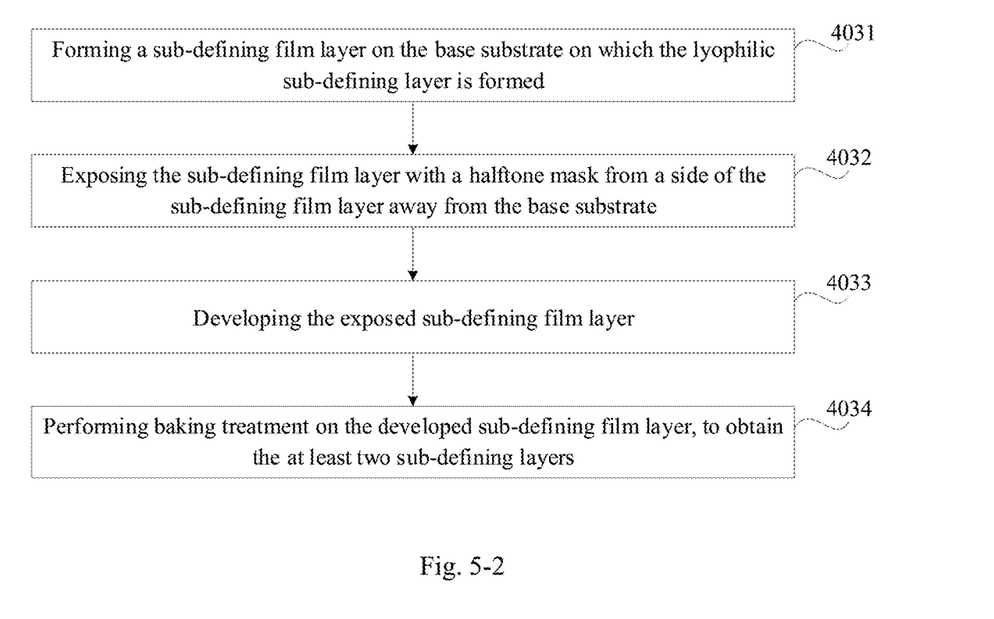

In an implementation manner, as shown in FIG. 5-2, the process of forming at least two sub-defining layers on the base substrate formed with the lyophilic sub-defining layer in block 403 may include the following blocks.

Block 4031, a sub-defining film layer is formed on the base substrate on which the lyophilic sub-defining layer is formed.

Optionally, a fluorine-containing photosensitive material having a certain thickness may be coated on the base substrate on which the lyophilic sub-defining layer is formed, to obtain a sub-defining film layer. Optionally, the fluorine-containing photosensitive material may be Asahi Glass AGC adhesive. The material of the sub-defining film layer contains fluorine, which can cause the surfaces of at least two sub-defining layers formed according to the sub-defining film layer to be lyophobic, and cause the side surfaces of the sub-defining layers to be lyophilic.

Figure 53:
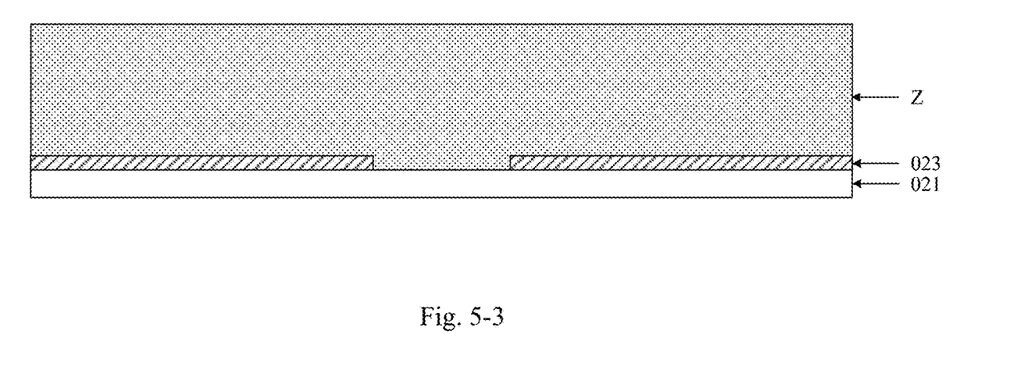

For example, please refer to FIG. 5-3, which illustrates a structural schematic diagram of forming a sub-defining film layer Z on a base substrate 021 on which a lyophilic sub-defining layer 023 is formed, according to an arrangement of the present disclosure.

Block 4032: the sub-defining film layer is exposed with a halftone mask from a side of the sub-defining film layer away from the base substrate.

Figure 54:
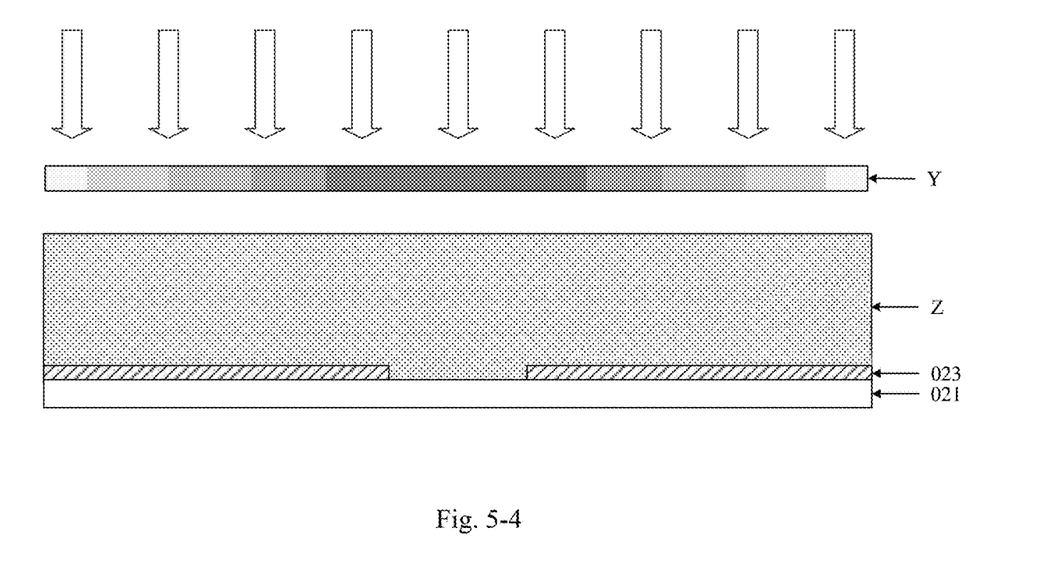
Figure 55:
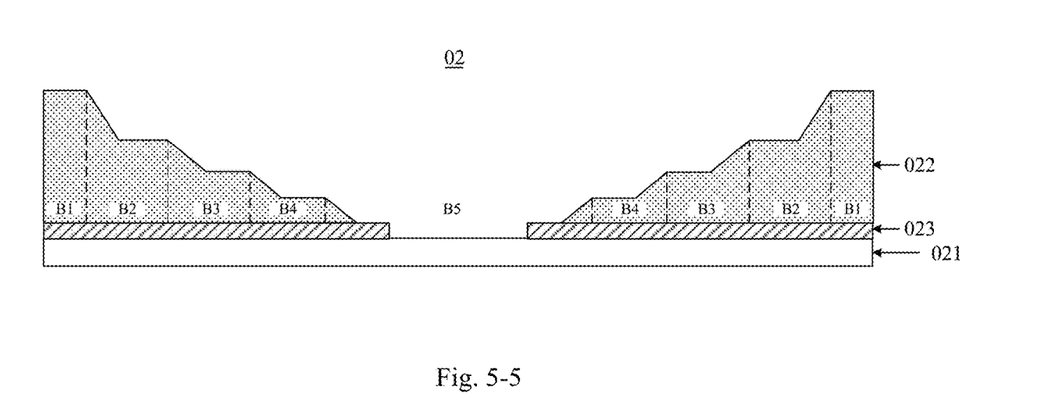

The halftone mask includes at least two light transmitting regions, and the at least two light transmitting regions have different degrees of light transmission. For example, please refer to the halftone mask Y shown in FIG. 5-4, the halftone mask Y includes five light transmitting regions (the portion having the same gray scale is referred to as a light transmitting region). When the degree of light transmission of the light transmitting region in the halftone mask is different, after the sub-defining film layer is exposed through the at least two light transmitting regions, at least two exposed regions having different exposure degrees can be formed, and respective exposed regions of the exposed sub-defining film layer have different thicknesses after being subject to development. For example, the sub-defining film layer is exposed through the halftone mask Y to obtain five exposed regions having different exposure degrees, and the five exposed regions are developed to obtain five regions as shown in FIG. 5-5. The five regions are regions B1, B2, B3, B4, and B5 respectively. The thicknesses of the five regions are different in the direction perpendicular to the base substrate (the thickness of the region B5 is 0), and the thickness of each region is the thickness as shown in FIG. 5-5. It should be noted that, in an ideal state, surfaces of the five regions parallel to the base substrate should be planar. However, in actual exposure and development processes, inclination angles as shown in FIG. 5-5 will be generated at joints of the five regions due to factors such as materials.

The exposure process will be described below by taking the sub-defining film layer being formed of a positive photoresist or a negative photoresist as an example.

For example, when the sub-defining film layer Z is formed of a positive photoresist (for example, Asahi Glass AGC adhesive), a schematic diagram of exposing the sub-defining film layer Z using the halftone mask Y is shown in FIG. 5-4. In the arrangement, the shade of gray scale of the halftone mask indicates the magnitude of light transmittance. The darker the gray scale is, the greater the light transmittance is. That is, the shade of gray scale of the halftone mask corresponds to the degree to be exposed of the portion of the sub-defining film layer covered by the orthographic projection of the halftone mask on the sub-defining film layer. The darker gray level indicates that the sub-defining film layer portion needs to be exposed to a greater degree. After the exposure, it can obtain the sub-defining film layer including five regions of different exposure degrees. The five regions of different exposure degrees include: a fully exposed region corresponding to the region B5 shown in FIG. 5-5, a partially exposed region corresponding to the region B4 shown in FIG. 5-5, another partially exposed region corresponding to the region B3 shown in FIG. 5-5, still another partially exposed region corresponding to the region B2 shown in FIG. 5-5, and a non-exposed region corresponding to the region B1 shown in FIG. 5-5.

For example, when the sub-defining film layer Z is formed of a negative photoresist, a schematic diagram of exposing the sub-defining film layer Z using the halftone mask Y is still shown in FIG. 5-4. In the arrangement, the shade of gray scale of the halftone mask indicates the magnitude of light transmittance. The darker the gray scale is, the smaller the light transmittance is. That is, the shade of gray scale of the halftone mask corresponds to the degree to be exposed of the portion of the sub-defining film layer covered by the orthographic projection of the halftone mask on the sub-defining film layer. The darker gray level indicates that the sub-defining film layer portion needs to be exposed to a smaller degree. After the exposure, it can obtain the sub-defining film layer including five regions of different exposure degrees. The five regions of different exposure degrees include: a fully exposed region corresponding to the region B5 shown in FIG. 5-5, a partially exposed region corresponding to the region B4 shown in FIG. 5-5, another partially exposed region corresponding to the region B3 shown in FIG. 5-5, still another partially exposed region corresponding to the region B2 shown in FIG. 5-5, and a non-exposed region corresponding to the region B1 shown in FIG. 5-5.

Block 4033, the exposed sub-defining film layer is developed.

The sub-defining film layer including a plurality of regions having different exposure degrees is developed, in this way, it is capable of removing the fluorine-containing photosensitive material in the fully exposed region, and retaining the fluorine-containing photosensitive material in the partially exposed region and the non-exposed region. After the development process, the sub-defining film layer of a predetermined shape can be obtained. The shape of the sub-defining film layer obtained after the development may have the overall shape of the at least two sub-defining layers 022 in FIG. 2, and the at least two sub-defining layers 022 are respectively sub-defining layers 0221, 0022, 0223, and 0224 laminatedly disposed on the base substrate 021. The exposure degree of each portion of the sub-defining film layer at the time of exposure is different, and accordingly, the degree of reaction of each portion with the developing solution during the development is different, and thus the part removed from each portion after development is different, so the sub-defining film layer obtained after development can have this shape.

Block 4034, thermal treatment is performed on the developed sub-defining film layer, to obtain the at least two sub-defining layers.

During the thermal treatment, the fluorine-containing component in the sub-defining film layer can move up to the surface of the sub-defining film layer. In this way, the surface of the sub-defining layer formed after the thermal treatment is lyophobic, and the side surface of the sub-defining layer is lyophilic. Please refer to FIG. 2 or FIG. 3 for the structure of at least two sub-defining layers 022 formed after the thermal treatment.

In this implementation, at least two sub-defining layers are formed by a sub-defining film layer formed on the base substrate subject to one patterning process, which simplifies the manufacturing process of the pixel defining layer.

In practical applications, at least two sub-defining layers may be formed by other implementation manners. For example, each sub-defining layer is sequentially formed on the base substrate, and the process of forming each sub-defining layer may include: coating material, exposure, and development and thermal treatment. Alternatively, at least two sub-defining layers may also be obtained by sequentially coating at least two material layers on the base substrate, and then performing exposure, development, and thermal treatment on the at least two material layers with a halftone mask. Alternatively, at least two sub-defining layers may also be obtained by forming a sub-defining film layer on the base substrate, and then exposing the sub-defining film layer multiple times by using a plurality of masks having different opening regions, and then performing development and thermal treatment on the exposed sub-defining film layer. The arrangement of the present disclosure does not limit this.

In summary, in a method of manufacturing a pixel defining layer according to an arrangement of the present disclosure, the pixel defining layer manufactured by the method includes at least two sub-defining layers sequentially and laminatedly disposed on a base substrate, and the surface of each sub-defining layer parallel to a surface of the base substrate is lyophobic, the side surface of each sub-defining layer is lyophilic, the lyophilic side surfaces attract the solution to ensure that the solution flows into the pixel region, and the lyophobic surfaces repel the solution to inhibit the solution from climbing on the pixel defining layer. In the pixel defining layer, each of the sub-defining layers suppresses climbing of one corresponding film layer in the organic light emitting layer on the pixel defining layer, so that climbing of a plurality of film layers included in the organic light emitting layer on the pixel defining layer is suppressed, which effectively improves the film formation uniformity of the solution in the pixel region, thus improving the uniformity of brightness in the pixel. Moreover, compared with the pixel defining layer according to the comparative arrangement, the pixel defining layer provided by the arrangement of the present disclosure can also simplify the manufacturing process of the pixel defining layer, thus reducing the probability of poorly manufacturing the pixel defining layer and reducing the manufacturing cost of the pixel defining layer.

It should be noted that the sequence of blocks of the method of manufacturing the pixel defining layer provided by the arrangement of the present disclosure may be appropriately adjusted, and the blocks may also be correspondingly increased or decreased according to situations. For example, when the lyophilic sub-defining layer is not included in the pixel defining layer, 402 may not be performed. Any method that can be easily conceived by those skilled in the art within the technical scope of the present disclosure is intended to be included within the protection scope of the present disclosure, and therefore will not be described again.

The arrangement of the present disclosure further provides a display substrate, which may include: a base substrate and a pixel defining layer disposed on the base substrate, the pixel defining layer being the pixel defining layer shown in FIG. 2 or FIG. 3.

Figure 6:
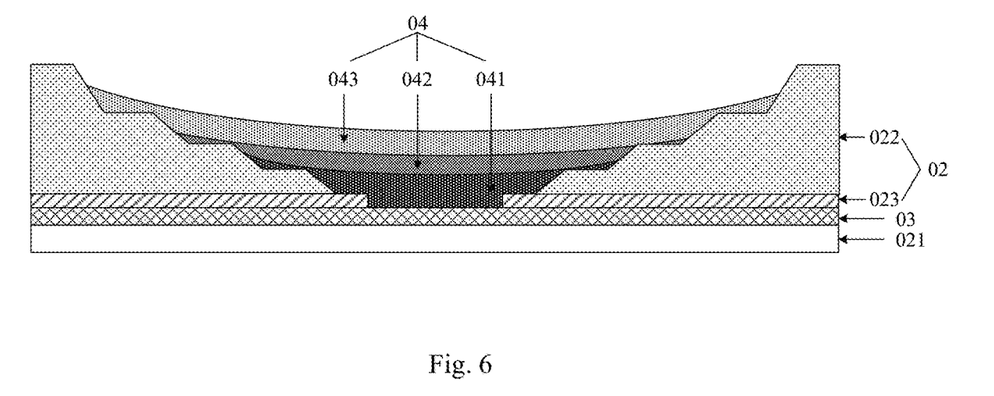
FIG. 6 is a schematic structural diagram of a display substrate according to an arrangement of the present disclosure.

Optionally, as shown in FIG. 6, the display substrate may further include: an anode 03 disposed between the base substrate 021 and the pixel defining layer 02, and an organic light emitting layer 04 disposed on a side of the anode 03 away from the base substrate 021. The anode may be formed of indium tin oxide (ITO).

The organic light emitting layer may include: at least two sub-layers disposed in a laminated manner, and the number of sub-layers included in the organic light emitting layer may be equal to the number of sub-defining layers included in the pixel-defining layer, and the thickness of each of the sub-layers disposed laminatedly in the organic light emitting layer is equal to that of each of the sub-defining layers disposed laminatedly on the base substrate included in the pixel-defining layer. For example, the thickness of each sub-layer and each sub-defining layer may be thickness in the order of several tens of nanometers. For example, when at least two sub-layers include a first sub-layer and a second sub-layer and the at least two sub-defining layers includes a first sub-defining layer and a second sub-defining layer laminatedly disposed on the base substrate, an upper surface of the first sub-defining layer is substantially coplanar with an upper surface of the first sub-layer, an upper surface of the second sub-defining layer is substantially coplanar with an upper surface of the second sub-layer. In this way, the thickness of the first sub-defining layer is substantially the same as that of the first sub-layer, and the thickness of the second sub-defining layer is substantially the same as that of the second sub-layer. In the arrangement of the present disclosure, the "upper surface" means the surface of the layer or structure located in the upper portion in the direction shown in the drawing. That is, as shown in FIG. 6, the "upper surface" indicates the surface of each layer that is away from the base substrate.

In practical applications, a schematic structural diagram of the manufactured display substrate is shown in FIG. 6. As shown in FIG. 6, the organic light emitting layer 04 may include: a hole injection layer 041, a hole transport layer 042, and an organic light emitting material layer 043. The pixel defining layer may include four sub-defining layers. The thickness of the first sub-defining layer is substantially the same as that of the hole injection layer 041, the thickness of the second sub-defining layer is substantially the same as that of the hole transport layer 042, and the thickness of the third sub-defining layer is substantially the same as that of the organic light emitting material layer 043. The thickness of the first sub-defining layer is the same as that of the hole injection layer, such that the first sub-defining layer can suppress climbing of the solution for forming the hole injection layer on the first sub-defining layer. The thickness of the second sub-defining layer is the same as that of the hole transport layer, such that the second sub-defining layer is capable of inhibiting the climbing of the solution for forming the hole transport layer on the second sub-defining layer. The thickness of the third sub-defining layer is the same as that of the organic light emitting material layer, such that the third defining layer is capable of inhibiting the climbing of the solution for forming the organic light emitting material layer on the third sub-defining layer.

In this arrangement, as shown in FIG. 6, the edge portion of the first sub-layer extends onto the upper surface of the first sub-defining layer and covers at least a portion of the upper surface of the first sub-defining layer and at least a portion of the side surface the second sub-defining layer. For example, taking the hole injection layer 041 as an example, the edge portion of the hole injection layer 041 extends onto the upper surface of the first sub-defining layer, and the extension portion covers the upper surface of the first sub-defining layer and at least a portion of the side surface of the second sub-defining layer.

According to the present disclosure, the upper surface of the first sub-defining layer is a lyophobic surface, and the side surfaces of both the first sub-defining layer and the second sub-defining layer are lyophilic surfaces, therefore, the portion of the first sub-layer extending onto the upper surface of the first sub-defining layer is repelled by the lyophobic surface and attracted by the lyophilic surface, such that the thickness of this portion is much smaller than that of the first sub-layer and thus may be negligible.

It should be noted that a side of the organic light emitting layer away from the base substrate may further be provided with a cathode. The organic light emitting layer may further include: film layers such as a hole blocking layer, an electron blocking layer, an electron transport layer, and an electron injection layer, which is not specifically limited in the arrangement of the present disclosure.

In summary, in the display substrate provided by the arrangement of the present disclosure, the pixel defining layer includes at least two sub-defining layers sequentially and laminatedly disposed on a base substrate, and the surface of each sub-defining layer parallel to a surface of the base substrate is lyophobic, the side surface of each sub-defining layer is lyophilic, the lyophilic side surfaces attract the solution to ensure that the solution flows into the pixel region, and the lyophobic surfaces repel the solution to inhibit the solution from climbing on the pixel defining layer. In the pixel defining layer, each of the sub-defining layers suppresses climbing of one corresponding film layer in the organic light emitting layer on the pixel defining layer, so that climbing of a plurality of film layers included in the organic light emitting layer on the pixel defining layer is suppressed, which effectively improves the film formation uniformity of the solution in the pixel region, thus improving the uniformity of brightness in the pixel and improving the display quality of the display substrate.

An arrangement of the present disclosure further provides a display panel, which may include the display substrate provided by arrangements of the present disclosure.

The display panel can be any product or component having a display function such as a liquid crystal panel, an electronic paper, a mobile phone, a tablet computer, a television, a display, a notebook computer, a digital photo frame, a navigator, and the like. For example, the display panel can be an OLED display panel.

The beneficial effects brought by the technical solutions provided by the arrangements of the present disclosure are:

in the pixel defining layer and the manufacturing method thereof, the display substrate, and the display panel provided by the arrangements of the present disclosure, the pixel defining layer includes at least two sub-defining layers sequentially and laminatedly disposed on a base substrate, and the surface of each sub-defining layer parallel to a surface of the base substrate is lyophobic, the side surface of each sub-defining layer is lyophilic, the lyophilic side surfaces attract the solution to ensure that the solution flows into the pixel region, and the lyophobic surfaces repel the solution to inhibit the solution from climbing on the pixel defining layer. In the pixel defining layer, each of the sub-defining layers suppresses climbing of one corresponding film layer in the organic light emitting layer on the pixel defining layer, so that climbing of a plurality of film layers included in the organic light emitting layer on the pixel defining layer is suppressed, which effectively improves the film formation uniformity of the solution in the pixel region, thus improving the uniformity of brightness in the pixel.

A person skilled in the art can understand that all or part of the blocks of implementing the above arrangements may be completed by hardware, or may be instructed by a program to execute related hardware, and the program may be stored in a computer readable storage medium. The storage medium mentioned above may be a read only memory, a magnetic disk or an optical disk or the like.

The above description is only the optional arrangement of the present disclosure, and is not intended to limit the present disclosure. Any modifications, equivalent substitutions, improvements, etc. within the spirit and principles of the present disclosure should be included in the protection scope of the present disclosure.

What is claimed is:

1. A pixel defining layer, comprising:
   first and second sub-defining layers sequentially and laminatedly disposed on a base substrate;
   wherein an orthographic projection of the second sub-defining layer, less closer to the base substrate, on the base substrate is located within an orthographic projection of the first sub-defining layer, closer to the base substrate, on the base substrate, and wherein a surface of each of the first and second sub-defining layers parallel to a surface of the base substrate is a lyophobic surface, and a side surface of each of the first and second sub-defining layers is a lyophilic surface.

2. The pixel defining layer according to claim 1, further comprising a lyophilic sub-defining layer disposed between the base substrate and the first and second sub-defining layers, wherein the orthographic projections of the first and second sub-defining layers on the base substrate are located within an orthographic projection of the lyophilic sub-defining layer on the base substrate, and wherein a surface of the lyophilic sub-defining layer is a lyophilic surface.

3. The pixel defining layer according to claim 1, wherein the first and second sub-defining layers are formed of an identical material.

4. The pixel defining layer according to claim 1, wherein the first and second sub-defining layers are formed of a fluorine-containing photosensitive material.

5. The pixel defining layer according to claim 4, wherein a fluorine content of the lyophobic surface of each of the first and second sub-defining layers is higher than a fluorine content of the lyophilic surface of each of the first and second sub-defining layers.

6. The pixel defining layer according to claim 1, wherein the first and second sub-defining layers are formed in an integrated structure.

7. A method for manufacturing a pixel defining layer, comprising:
   providing a base substrate; and
   forming first and second sub-defining layers on the base substrate, wherein an orthographic projection of the second sub-defining layer, less closer to the base substrate, on the base substrate is located within an orthographic projection of the first sub-defining layer, closer to the base substrate, on the base substrate, a surface of each of the first and second sub-defining layers parallel to a surface of the base substrate is a lyophobic surface, and a side surface of each of the first and second sub-defining layers is a lyophilic surface.

8. The manufacturing method according to claim 7, wherein before forming the first and second sub-defining layers on the base substrate, the method further comprises:
   forming a lyophilic sub-defining layer on the base substrate, the orthographic projections of the first and second two sub-defining layers on the base substrate are located within an orthographic projection of the lyophilic sub-defining layer on the base substrate, and a surface of the lyophilic sub-defining layer is a lyophilic surface.

9. The manufacturing method according to claim 7, wherein forming first and second sub-defining layers on the base substrate comprises:
   forming a sub-defining film layer on the base substrate;
   exposing the sub-defining film layer with a halftone mask from a side of the sub-defining film layer away from the base substrate;
   developing the exposed sub-defining film layer; and
   performing thermal treatment on the developed sub-defining film layer to obtain the first and second sub-defining layers.

10. The manufacturing method according to claim 9, wherein the sub-defining film layer is formed of a fluorine-containing photosensitive material.

11. The manufacturing method according to claim 10, wherein a fluorine content of the lyophobic surface of each of the first and second sub-defining layers is higher than a fluorine content of the lyophilic surface of each of the first and second sub-defining layers.

12. The manufacturing method according to claim 10, wherein the halftone mask comprises at least two light transmitting regions, and the at least two light transmitting regions have different degrees of light transmission, and exposing the sub-defining film layer with a halftone mask comprises:
   exposing the sub-defining film layer through the at least two light transmitting regions, such that the exposed sub-defining film layer comprises at least two exposed regions, wherein respective exposed regions of the exposed sub-defining film layer have different thicknesses after developing the exposed sub-defining film layer.

13. A display substrate, comprising the pixel defining layer according to claim 1.

14. The display substrate according to claim 13, wherein the display substrate further comprises: an anode disposed between the base substrate and the pixel defining layer, and an organic light emitting layer disposed on a side of the anode away from the base substrate.

15. The display substrate according to claim 14, wherein the organic light emitting layer comprises: at least two sub-layers disposed in a laminated manner, wherein the at least two sub-layers comprise: a first sub-layer and a second sub-layer, wherein an upper surface of the first sub-defining layer is substantially coplanar with an upper surface of the first sub-layer, and upper surface of the second sub-defining layer is substantially coplanar with an upper surface of the second sub-layer.

16. The display substrate according to claim 15, wherein an edge portion of the first sub-layer extends onto the upper surface of the first sub-defining layer and is overlapped with at least a portion of the upper surface of the first sub-defining layer and at least a portion of a side surface of the second sub-defining layer.

17. The display substrate according to claim 16, wherein a thickness of the edge portion of the first sub-layer extending onto the upper surface of the first sub-defining layer is smaller than a thickness of the first sub-layer.

18. A display panel comprising: the display substrate according to claim 13.

19. The pixel defining layer according to claim 1, wherein centers of the orthographic projections of the first and second sub-defining layers coincide.

20. The pixel defining layer according to claim 1, wherein edges of the orthographic projections of the first and second orthographic projections are offset by a certain distance.

* * * * *